United States Patent
Linderman

(10) Patent No.: US 9,281,431 B2
(45) Date of Patent: *Mar. 8, 2016

(54) THERMAL TRACKING FOR SOLAR SYSTEMS

(71) Applicant: SUNPOWER CORPORATION, San Jose, CA (US)

(72) Inventor: Ryan J. Linderman, Oakland, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 91 days.

This patent is subject to a terminal disclaimer.

(21) Appl. No.: 14/099,739

(22) Filed: Dec. 6, 2013

(65) Prior Publication Data

US 2014/0090691 A1  Apr. 3, 2014

Related U.S. Application Data

(63) Continuation of application No. 12/829,263, filed on Jul. 1, 2010, now Pat. No. 8,604,404.

(51) Int. Cl.
*G01C 21/02* (2006.01)
*H01L 31/052* (2014.01)
(Continued)

(52) U.S. Cl.
CPC ............... *H01L 31/0525* (2013.01); *F24J 2/07* (2013.01); *F24J 2/14* (2013.01); *F24J 2/38* (2013.01); *F24J 2/402* (2013.01); *H01L 31/0547* (2014.12); *Y02E 10/52* (2013.01)

(58) Field of Classification Search
CPC .......................... H01L 31/0525; H01L 31/0547
USPC ....................................... 250/203.4; 136/246
See application file for complete search history.

(56) References Cited

U.S. PATENT DOCUMENTS 4,153,474 A  5/1979  Rex
4,323,719 A  4/1982  Green
(Continued)

FOREIGN PATENT DOCUMENTS

DE      10041271    3/2002
DE    202004005198  8/2004
(Continued)

OTHER PUBLICATIONS

Bardwell, Karen et al., "Minimizing End Shadowing Effects on Parabolic Concentrator Arrays," IEEE, 1980, pp. 765-770.
(Continued)

*Primary Examiner* — Thanh Luu
(74) *Attorney, Agent, or Firm* — Knobbe, Martens, Olson & Bear LLP

(57) ABSTRACT

A power generating system is disclosed. The power generating system comprises a solar cell, a support structure coupled to the solar cell and adapted to adjust the position of the solar cell, a first thermal sensor coupled to the solar cell and adapted to detect a first temperature at a first location on the solar cell, a second thermal sensor coupled to the solar cell and adapted to detect a second temperature at a second location on the solar cell, the second location spaced apart from the first location, and a control system. The control system is adapted to receive a first signal from the first thermal sensor and a second signal from the second thermal sensor, compare information conveyed in the first and second signals, and adjust the position of the solar cell by operating the support structure in response to information conveyed in the first and second signals.

20 Claims, 8 Drawing Sheets

(51) Int. Cl.
*H01L 31/054* (2014.01)
*F24J 2/07* (2006.01)
*F24J 2/14* (2006.01)
*F24J 2/38* (2014.01)
*F24J 2/40* (2006.01)

(56) References Cited

U.S. PATENT DOCUMENTS

| | | | |
|---|---|---|---|
| 4,354,484 A * | 10/1982 | Malone et al. | 126/602 |
| 4,373,783 A | 2/1983 | Anderson | |
| 4,456,332 A | 6/1984 | Anderson | |
| 4,468,848 A | 9/1984 | Anderson et al. | |
| 4,468,849 A | 9/1984 | Anderson et al. | |
| 4,481,378 A | 11/1984 | Lesk | |
| 4,502,200 A | 3/1985 | Anderson et al. | |
| 4,640,734 A | 2/1987 | Roberts et al. | |
| 4,643,543 A | 2/1987 | Mohn et al. | |
| 4,643,544 A | 2/1987 | Loughran | |
| 4,759,803 A | 7/1988 | Cohen | |
| 5,180,441 A | 1/1993 | Cornwall et al. | |
| 5,248,346 A | 9/1993 | Fraas et al. | |
| 5,334,496 A | 8/1994 | Pond et al. | |
| 5,344,496 A | 9/1994 | Stern et al. | |
| 5,389,158 A | 2/1995 | Fraas et al. | |
| 5,409,549 A | 4/1995 | Mori | |
| 5,498,297 A | 3/1996 | O'Neill et al. | |
| 5,580,395 A | 12/1996 | Yoshioka et al. | |
| 5,616,185 A | 4/1997 | Kukulka | |
| 5,660,644 A | 8/1997 | Clemens | |
| 5,697,192 A | 12/1997 | Inoue | |
| 5,865,905 A | 2/1999 | Clemens | |
| 5,899,199 A | 5/1999 | Mills | |
| 5,990,415 A | 11/1999 | Green et al. | |
| 6,034,322 A | 3/2000 | Pollard | |
| 6,131,565 A | 10/2000 | Mills | |
| 6,323,478 B1 | 11/2001 | Fujisaki et al. | |
| 6,359,209 B1 | 3/2002 | Glenn et al. | |
| 6,442,937 B1 | 9/2002 | Stone et al. | |
| 6,553,729 B1 | 4/2003 | Nath et al. | |
| 6,635,507 B1 | 10/2003 | Boutros et al. | |
| 7,109,461 B2 | 9/2006 | Lasich | |
| 7,468,485 B1 | 12/2008 | Swanson | |
| 7,554,031 B2 | 6/2009 | Swanson et al. | |
| 7,709,730 B2 | 5/2010 | Johnson et al. | |
| 7,820,906 B2 | 10/2010 | Johnson et al. | |
| 7,825,327 B2 | 11/2010 | Johnson et al. | |
| 7,932,461 B2 | 4/2011 | Johnson et al. | |
| 7,952,057 B2 | 5/2011 | Finot et al. | |
| 7,968,791 B2 | 6/2011 | Do et al. | |
| 8,049,150 B2 | 11/2011 | Johnson et al. | |
| 8,083,362 B2 | 12/2011 | Finot et al. | |
| 8,604,404 B1 * | 12/2013 | Linderman | 250/203.4 |
| 2004/0074490 A1 | 4/2004 | Mills et al. | |
| 2007/0151598 A1 | 7/2007 | De Ceuster et al. | |
| 2007/0257274 A1 | 11/2007 | Martter et al. | |
| 2008/0035198 A1 | 2/2008 | Teppe et al. | |
| 2009/0056699 A1 | 3/2009 | Mills et al. | |
| 2009/0056785 A1 | 3/2009 | Johnson et al. | |
| 2009/0056786 A1 | 3/2009 | Johnson et al. | |
| 2009/0056787 A1 | 3/2009 | Johnson et al. | |
| 2009/0084375 A1 * | 4/2009 | Xie | 126/684 |
| 2009/0095284 A1 | 4/2009 | Klotz | |
| 2009/0139557 A1 | 6/2009 | Rose et al. | |
| 2010/0154788 A1 | 6/2010 | Wells et al. | |
| 2010/0163014 A1 | 7/2010 | Johnson et al. | |
| 2010/0175740 A1 | 7/2010 | Johnson et al. | |
| 2010/0193014 A1 | 8/2010 | Johnson et al. | |
| 2010/0236626 A1 | 9/2010 | Finot et al. | |
| 2010/0294336 A1 | 11/2010 | Johnson et al. | |
| 2010/0319682 A1 | 12/2010 | Klotz | |
| 2011/0023940 A1 | 2/2011 | Do et al. | |
| 2011/0132457 A1 | 6/2011 | Finot | |
| 2011/0186130 A1 | 8/2011 | Finot et al. | |
| 2011/0226309 A1 | 9/2011 | Do et al. | |
| 2011/0226310 A1 | 9/2011 | Johnson et al. | |
| 2011/0265869 A1 | 11/2011 | Finot et al. | |

FOREIGN PATENT DOCUMENTS

| | | |
|---|---|---|
| DE | 10 2008 035 735 | 2/2010 |
| GB | 2340993 | 3/2000 |
| JP | 2007184542 | 7/2007 |
| JP | 2007194521 | 8/2007 |
| JP | 2007214247 | 8/2007 |
| KR | 1020070070183 | 7/2007 |
| KR | 1020090014153 | 2/2009 |
| WO | WO9957493 | 11/1999 |
| WO | WO2007096157 | 8/2007 |
| WO | WO2007096158 | 8/2007 |
| WO | WO2008022409 | 2/2008 |
| WO | WO2008153922 | 12/2008 |
| WO | WO2009023063 | 2/2009 |
| WO | WO2009029275 | 3/2009 |
| WO | WO2009029277 | 3/2009 |

OTHER PUBLICATIONS

Carroll, Don et al. "Production of the Alpha Solarco Proof-of-Concept Array," IEEE, 1990, pp. 1136-1141.

Edenburn, Michael W., et al. "Shading Analysis of a Photovoltaic Cell String Illuminated by a Parabolic Trough Concentrator," IEEE, 1981, pp. 63-68.

Quagan, Robert J., "Laser Diode Heat Spreaders," Ion Beam Milling, Inc., website copyright 2010, http://www.ionbeammilling.com/default.asp, 9 pgs.

Shepard, Jr., N. F. et al., "The Integration of Bypass Diodes with Terrestrial Photovoltaic Modules and Arrays," IEEE, 1984, pp. 676-681.

Stern, T. G., "Interim results of the SLATS concentrator experiment on LIPS-II (space vehicle power plants)," Photovoltaic Specialists Conference, 1988., Conference Record of the Twentieth IEEE , vol., no., pp. 837-840 vol. 2, 1988. URL: http://ieeexplore.ieee.org/stamp/stamp.jsp?tp=&arnumber=105822&isnumber=3239.

Vivar Garcia, Marta, "Optimisation of the Euclides Photovoltaic Concentrator," 2009, 390 pages.

* cited by examiner

THERMAL TRACKING FOR SOLAR SYSTEMS

CROSS-REFERENCE TO RELATED APPLICATIONS

This application is a continuation of U.S. patent application Ser. No. 12/829,263, filed Jul. 1, 2010, entitled "THERMAL TRACKING FOR SOLAR SYSTEMS," which is incorporated by reference herein in its entirety and for all purposes.

TECHNICAL FIELD

Embodiments of the subject matter described herein relate generally to sensing and feedback systems. More particularly, embodiments of the subject matter relate to tracking systems for solar panels.

BACKGROUND OF THE INVENTION

Solar systems which track apparent movement of the sun across the sky during the day typically use sensors to determine the position of the sun and adjust the solar system accordingly. A variety of techniques are currently used to operate solar systems. For example, sun position tables generated from known longitude and latitude can be used to predict the location of the sun during the course of the day. The deviation between predicted and actual position can be significant. Some sources of alignment error can be caused, for example, by inaccurate site location, contributions from an inclinometer, motor encoder, or other positioning equipment error. Although seemingly small, a single degree of alignment error can translate into an efficiency decrease of over 10%, particularly when aligning a solar concentrating system. Moreover, for solar concentrating systems, reduced alignment error permits accurate placement of concentrated sunlight. When concentrated sunlight can be directed more accurately, the associated solar cell and receiver can be of a smaller size than one which needs to be larger to allow for misaligned concentrated sunlight. The reduced size of the solar cell and receiver allows for cost savings in material and fabrication.

As an alternative to such dead reckoning techniques, feedback-based tracking systems are sometimes used. Such feedback systems can include cameras, which interpret visual imagery to locate the sun's position and align the solar system accordingly. Cameras are, however, typically expensive, and can require extensive and sophisticated signal processing to determine a precise solar position. Additionally, the camera element will encounter environmental effects which can decrease its efficacy as a sensor. Moreover, imprecision in mounting the camera also can result in alignment error.

Another feedback-based approach operates by inspecting the power generated by the system to determine the optimal alignment. Such power feedback systems typically intentionally introduce a small deviation to the system for the purpose of determining the peak power output based on alignment of the solar system. High speed electronics, which can be expensive, are required to perform the rapid inspection needed to determine the optimum alignment profile. Additionally, small changes in irradiance due to clouds or air masses can produce a condition similar to a misalignment condition, thereby confusing the tracker. Consequently, the tracker can introduce erroneous misalignment, thereby reducing efficiency.

Current tracking systems, therefore, can be expensive, introduce misalignment error even under optimal conditions, and can have sensitive components exposed to detrimental environmental conditions. Notwithstanding the difficulties in cheaply and accurately positioning a solar system, it is desirable to perform such tracking to increase the efficiency of the system.

BRIEF SUMMARY

A power generating system is disclosed. The power generating system comprises a solar cell, a support structure coupled to the solar cell and adapted to adjust the position of the solar cell, a first thermal sensor coupled to the solar cell and adapted to detect a first temperature at a first location on the solar cell, a second thermal sensor coupled to the solar cell and adapted to detect a second temperature at a second location on the solar cell, the second location spaced apart from the first location, and a control system. The control system is adapted to receive a first signal from the first thermal sensor and a second signal from the second thermal sensor, compare information conveyed in the first and second signals, and adjust the position of the solar cell by operating the support structure in response to information conveyed in the first and second signals.

A method of adjusting a position of a solar cell is also disclosed. The method comprises detecting a first temperature at a first location of the solar cell, detecting a second temperature at a second location of the solar cell, the second location spaced apart from the first location, comparing the first temperature and second temperature, and adjusting the position of the solar cell in response to comparing the first and second temperatures.

A method of tracking the sun with a solar cell is also disclosed. The method comprises measuring a first intensity of solar radiation at a first location on the solar cell, measuring a second intensity of solar radiation at a second location on the solar cell, the second location spaced apart from the first location, comparing the first intensity to the second intensity, and adjusting the position of the solar cell in response to the comparison between the first intensity and the second intensity.

A method of controlling a position of a solar cell, the solar cell having a primary axis extending in a first direction and a secondary axis extending in a second direction, the first and second directions being different directions, is also disclosed. The method comprises detecting a first temperature at a first location and a second temperature at a second location, the second location spaced apart in the first direction from the first location, comparing the first temperature to the second temperature to determine a first temperature gradient in the first direction, adjusting the position of the solar cell by rotating it around the secondary axis, thereby changing the first temperature gradient, detecting a third temperature at a third location and a fourth temperature at a fourth location, the fourth location spaced apart in the second direction from the third location, comparing the third temperature to the fourth temperature to determine a second temperature gradient in the second direction, and adjusting the position of the solar cell by rotating it around the primary axis, thereby changing the second temperature gradient.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION OF THE PREFERRED EMBODIMENT

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components and with reference to symbolic representations of operations, processing tasks, and functions that may be performed by various computing components or devices. In practice, one or more processor devices can carry out the described operations, tasks, and functions by manipulating electrical signals representing data bits at memory locations in the system memory, as well as other processing of signals. For example, an embodiment of a system or a component, such as a controller or control system, may employ various integrated circuit components, e.g., memory elements, digital signal processing elements, logic elements, look-up tables, or the like, which may carry out a variety of functions under the control of one or more microprocessors or other control devices.

Figure 10:
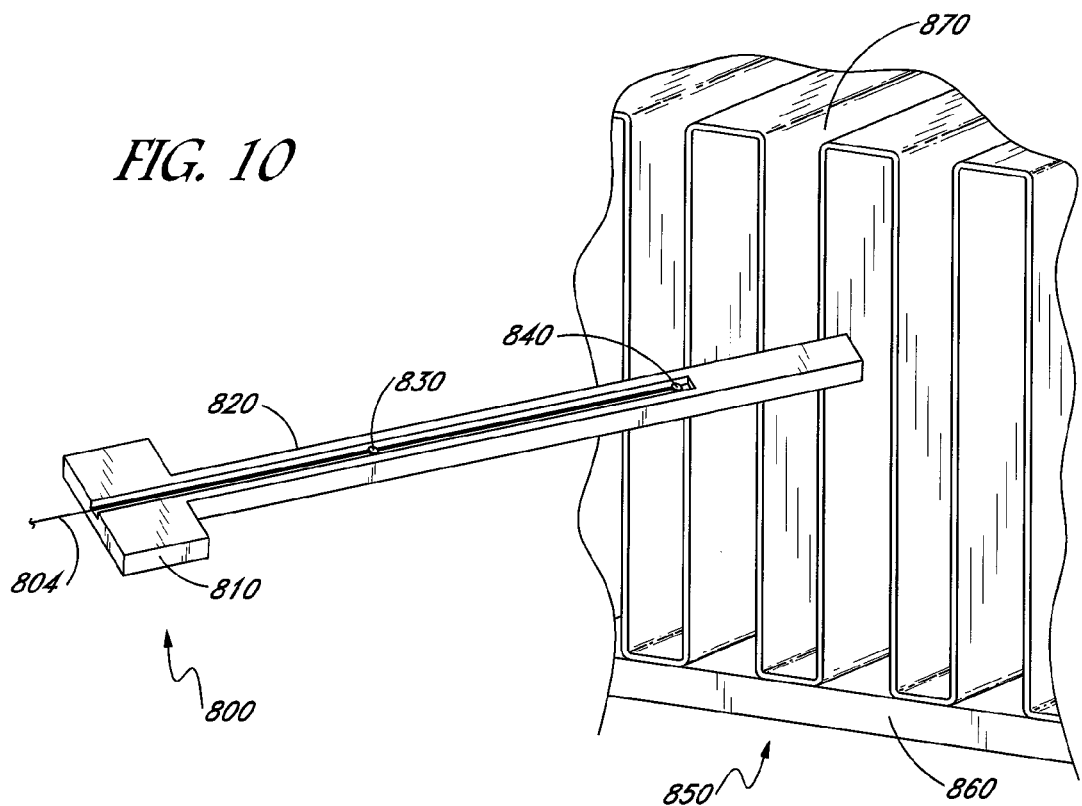
FIG. 10 is an exploded, perspective view of a sensor coupling device and portion of a solar system.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematic shown in FIG. 10 depicts one exemplary arrangement of elements, additional intervening elements, devices, features, or components may be present in an embodiment of the depicted subject matter.

"Adjust"—Some elements, components, and/or features are described as being adjustable or adjusted. As used herein, unless expressly stated otherwise, "adjust" means to position, modify, alter, or dispose an element or component or portion thereof as suitable to the circumstance and embodiment. In certain cases, the element or component, or portion thereof, can remain in an unchanged position, state, and/or condition as a result of adjustment, if appropriate or desirable for the embodiment under the circumstances. In some cases, the element or component can be altered, changed, or modified to a new position, state, and/or condition as a result of adjustment, if appropriate or desired.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", "inboard", and the like describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

Unlike imaging and power-feedback systems, thermal tracking for solar systems provides low misalignment error with only a minor cost. The temperature profile of a solar cell receiving solar radiation can provide useful information for properly aligning the solar system containing the cell. As is described in greater detail below, by measuring the temperature at various points in and on the solar module, feedback can be provided to the aligning system to reduce the misalignment error.

Figure 1:
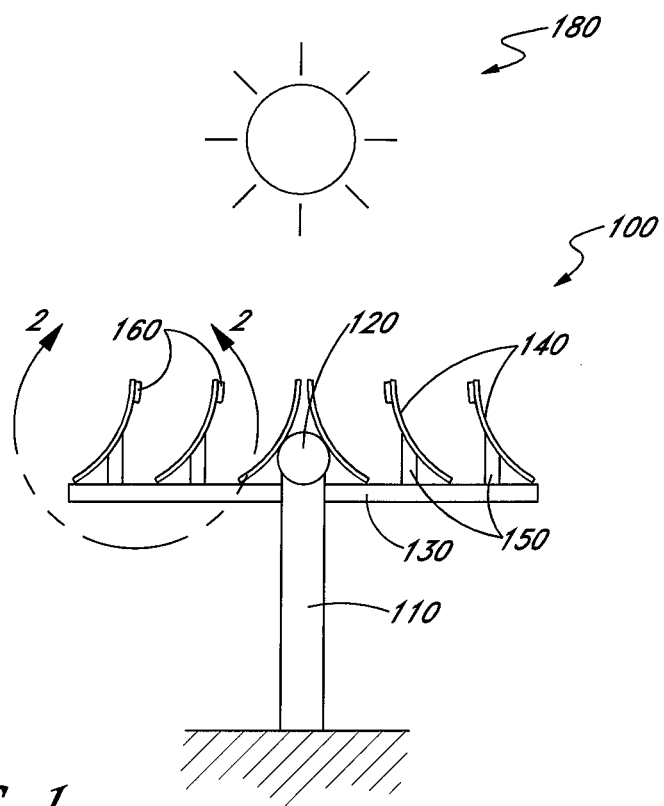
FIG. 1 is a side view of a solar system in an operational state.

FIG. 1 illustrates a view of a solar system 100 being irradiated by the sun 180. The solar system 100 is a concentrator system, although other solar systems can embody the features described. The solar system comprises a pier 110, a torque tube 120, a cross beam 130, several solar concentrators 140 positioned and maintained by supports 150, and solar receivers 160. The solar system 100 can adjust the position of the solar concentrators 140 to permit concentration of light from the sun 180 onto the solar receivers 160. The solar receivers 160 can be photovoltaic solar cells, or portions thereof, which convert the received sunlight into electrical current. Additional features can be incorporated into the solar system 100. For clarity and descriptive purposes, these are omitted.

Figure 2:
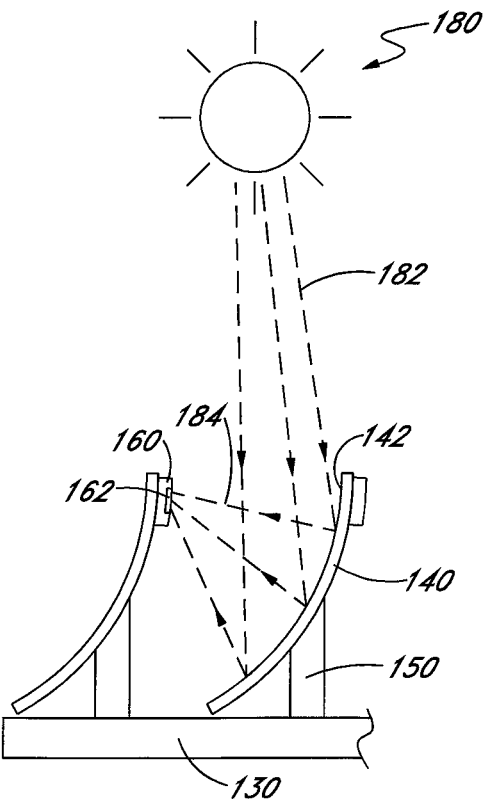
FIG. 2 is a detailed view of a portion of the solar system of FIG. 1.

FIG. 2 illustrates a detailed view of a portion of the solar system 100 of FIG. 1. The solar concentrators 140 can have any of a number of shapes and sizes, such as the parabolic reflectors shown. The reflecting surface 142 can receive unfocused sunlight 182 and reflect and concentrate it into concentrated sunlight 184. The intensity of concentrated sunlight provided to a receiver, such as solar receiver 160, can be referred to by a measure of the intensity of illumination relative to unconcentrated sunlight. For example, a concentrator which provides concentrated sunlight which has twice the intensity of unconcentrated sunlight is said to provide two suns. The illustrated solar concentrator 140 can provide seven suns, although the amount of concentration can vary between embodiments. In certain embodiments, the solar system 100 can operate without a solar concentrator 140, and the solar receiver 160 can receive unconcentrated sunlight.

Preferably, the solar concentrator 140 directs the concentrated sunlight 184 to a predetermined location on the solar receiver 160. The solar receiver 160 includes a photovoltaic solar cell. The concentrated sunlight 184 preferably impinges on the solar cell 162 to permit electrical energy generation. The solar receiver 160 can include several components interoperating to produce electrical energy, as described in greater detail below. One face of the solar receiver 160 can be positioned to face toward the solar concentrator 140, receiving the concentrated sunlight 184. This face preferably includes the photovoltaic solar cell 162. It is desirable to position the solar system 100 such that the concentrated sunlight 184 reflected by the solar concentrator 140 impinges exclusively on the photovoltaic solar cell 162, and not other portions of the solar receiver 160, thereby increasing the electrical output of the solar cell 162 and, consequently, overall system efficiency. FIG. 2 illustrates a position where the concentrated sunlight 184 is appropriately directed.

Figure 3:
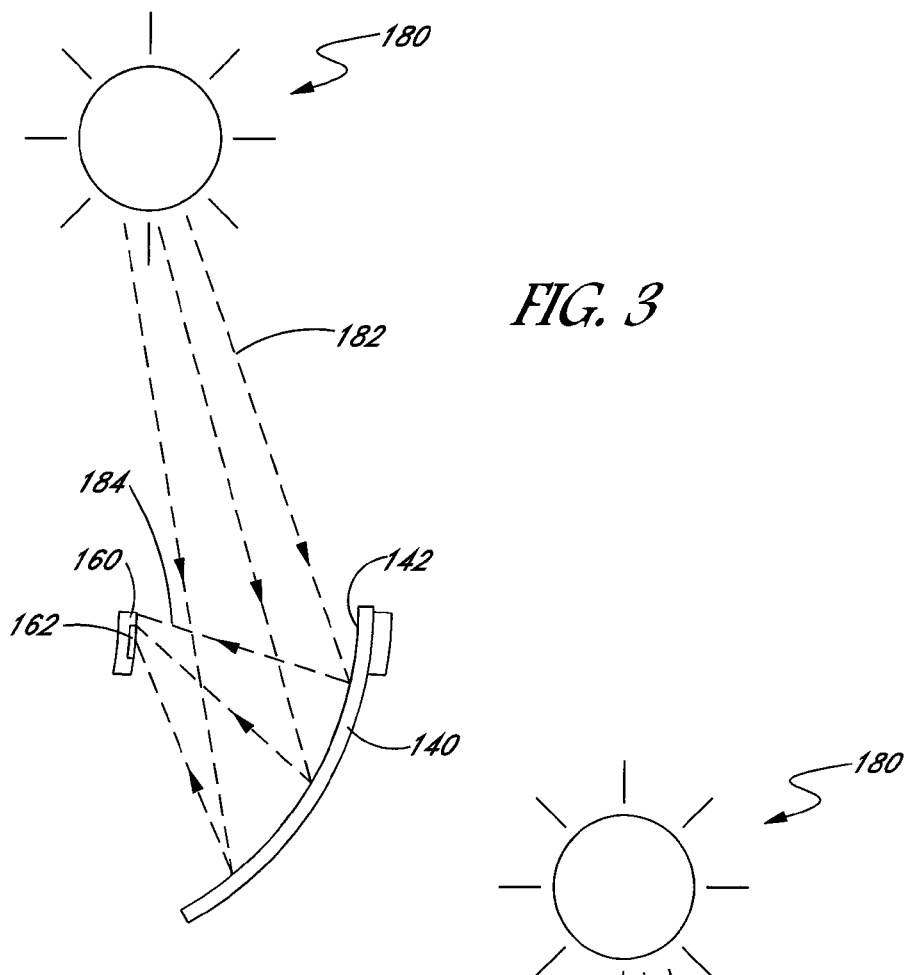
FIG. 3 is a view of a solar concentrator and solar receiver in a first position.

FIG. 3 illustrates a positioning of the solar system 100 wherein the solar concentrator 140 is not properly positioned. In the illustrated position, concentrated sunlight 184 impinges on the high side of the solar receiver 160. A portion of the solar cell 162 is not illuminated by the concentrated sunlight 184, and other components above the solar cell 162, such as an encapsulant, backing, or frame, are instead receiving the concentrated sunlight 184.

Figure 4:
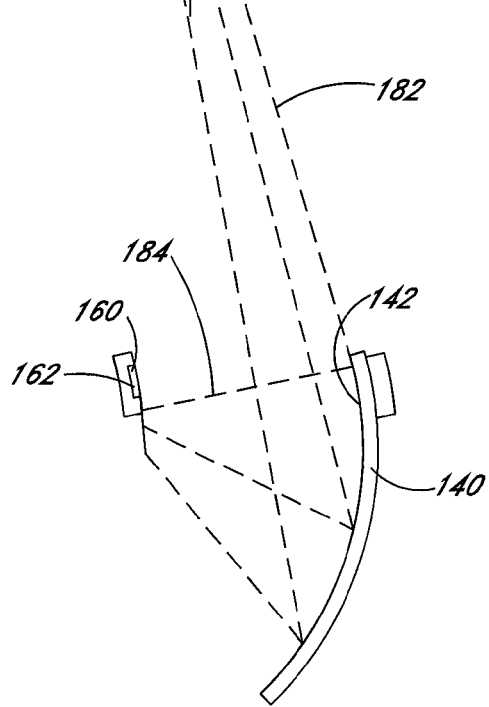
FIG. 4 is a view of the solar concentrator and solar receiver of FIG. 3 in a second position

FIG. 4 illustrates another position of the solar system 100 wherein the solar concentrator 140 is undesirably positioned. In this position, the concentrated sunlight 184 is directed below the solar cell 162. Although some concentrated sunlight 184 can impinge on the solar cell 162 in either position illustrated in FIG. 3 or 4, it is undesirably less than substantially all of the concentrated sunlight 184.

Figure 5:
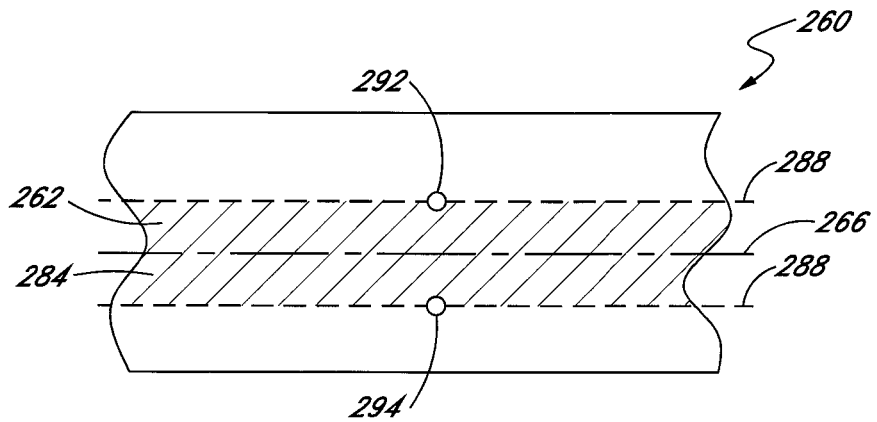
FIG. 5 is view of a solar receiver in a first condition.
Figure 6:
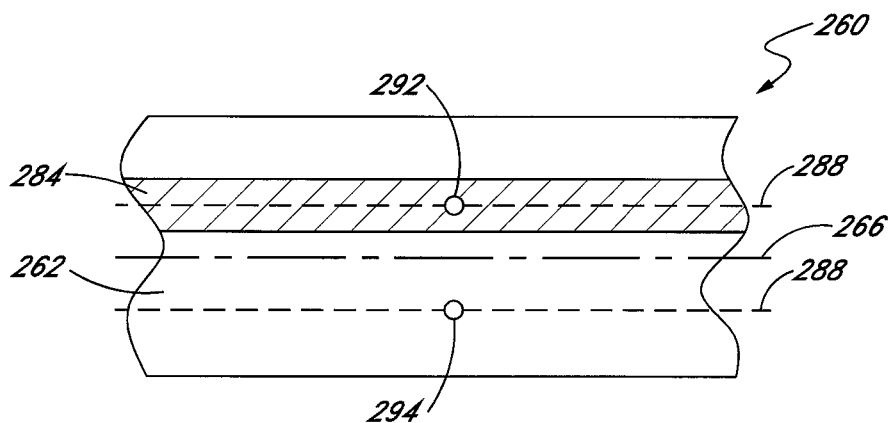
FIG. 6 is a view of the solar receiver of FIG. 5 in a second condition.
Figure 7:
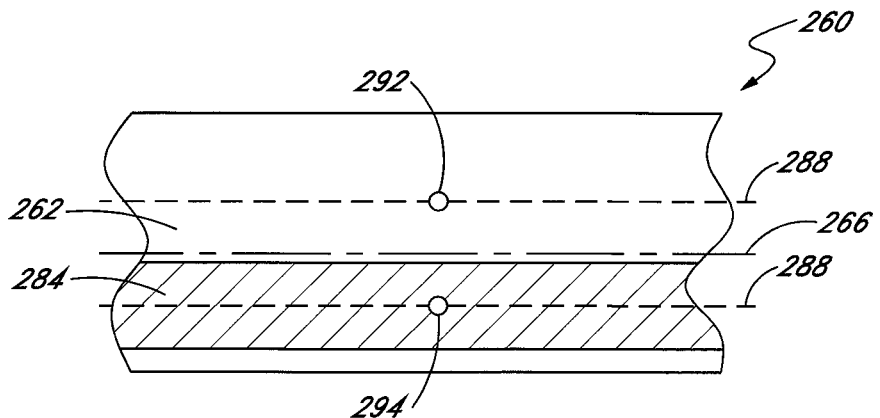
FIG. 7 is a view of the solar receiver of FIG. 5 in a third condition.

FIGS. 5-7 illustrate embodiments of solar receivers 260 receiving concentrated sunlight 284. Unless otherwise indicated, numerical designations for components are similar to those used above in FIGS. 1-4, except that they have been incremented by 100. Additionally, some features and components of the solar system incorporating the solar receivers 260 have been omitted for clarity.

FIG. 5 illustrates a solar receiver 260 having a solar cell 262 extending across its surface. The solar receiver 260 has a centerline 266. In the illustrated embodiment, the centerline 266 also extends across the vertical center of the solar cell 262, although in other embodiments, this need not be the case. The centerline 266 is used for descriptive reference only and does not indicate a functional or actual center. The solar cell 262 has upper and lower bounds 288, and extends horizontally along the solar receiver 260. Concentrated sunlight 284 impinges on the solar cell 262, desirably positioned to on the solar cell 262. In some embodiments, the solar cell 262 can be separated into different segments or sections. In certain embodiments, the solar cell 262 can extend further vertically than the height of the concentrated sunlight 284, and vice versa. Thus, although shown the same height here for ease of description, various embodiments can have different characteristics which still employ aspects of the systems and techniques described.

The solar receiver 260 can also have first and second thermal sensors 292, 294. The thermal sensors 292, 294 are preferably spaced apart in a horizontal or, as shown here, vertical direction. Although shown positioned along the edges of the solar cell 262, as indicated by bounds 288, the thermal sensors 292, 294 can be offset either towards the centerline 266 or away from it. Preferably, however, the thermal sensors 292, 294 are the same distance from the center of the solar cell 262, although they can be different distances, as described below. The thermal sensors 292, 294 can be any type of thermal sensor, such as a thermocouple, resistive temperature detector, thermistor, or other such device. As described below, other types of sensor can be used in different embodiments, such as optical sensors, including those configured to detect and/or measure luminosity. The sensor selected should have sensitivity and reporting frequency characteristics as desired for interoperation with other components, including a control system. Preferably, sensors having sensitivity to a tenth of a degree Celsius and/or a clock cycle of approximately 60 Hz are used, though others with varying characteristics can be used without departing from the spirit of the embodiments described herein.

The thermal sensors 292, 294 can be situated in the solar receiver 260 to detect the temperature in the portion of the solar receiver 260 immediately surrounding the respective sensor. While transient environmental effects can affect temperature measurements at the sites of the thermal sensors 292, 294, the thermal effect of the position of the concentrated sunlight 284 onto the cell 262 predominates. Thus, when the thermal sensors 292, 294 are positioned at approximately equal distances from the center of the concentrated sunlight 284, here co-axial with the centerline 266, they detect approximately the same temperature.

The inventor has discovered that a change in alignment of the concentrated sunlight 284, such as that caused by misalignment error, results in easily detectable temperature difference between two thermal sensors positioned similarly to thermal sensors 292, 294. In some concentrators, depending on the intensity of concentration, the temperature difference can be as much as 8° C. per degree of alignment variation. Although illustrated for clarity as a well-bounded area, concentrated sunlight 284 can, in practice, have a boundary wherein temperature gradually decreases as intensity of irradiance decreases. Because solar concentrators do not have perfect concentration profiles, some boundary variation is present. Nonetheless, temperature measurements at or near a designed or desired boundary location can correspond to prescribed alignment characteristics.

FIG. 6 illustrates a different alignment circumstance, wherein the concentrated sunlight 284 is misaligned. The concentrated sunlight 284 is impinging on less than half of the solar cell 262. The first thermal sensor 292 is positioned within the area of irradiance, while the second thermal sensor 294 is positioned below the area of irradiance. Accordingly, the first thermal sensor 292 will detect a higher temperature than the second thermal sensor 294.

By comparing the temperature difference detected between the first and second thermal sensors 292, 294, the solar system supporting the solar receiver 260 can be operated to a new position which desirably reduces the misalignment or tracking error. Accordingly, a control system is preferably configured to receive information from the thermal sensors 292, 294 and can control one or more positioning motors to change the position of the solar system, thereby changing the position of the solar concentrator directing the concentrated sunlight 284, and more desirably positioning it to impinge on the solar cell 262, such as to a position like the one illustrated in FIG. 5.

In FIG. 7, a reverse case to that illustrated in FIG. 6 is shown. The concentrated sunlight 284 is misaligned downward on the face of the solar receiver 260. Accordingly, the second thermal sensor 294 detects a higher temperature than the first thermal sensor 292. Additionally the inventor has discovered that as the ambient temperature, irradiance, and wind speed globally increases or decreases, the absolute temperature of thermal sensors 292, 294 also increases or decreases at the same rate however the relative temperature difference between thermal sensors 292, 294 is dominated by the location of the concentrated irradiance on the cell 262. Thus, the two sensors working together as an alignment sensor are not sensitive to the changes in weather and global irradiance as other tracking techniques are.

Figure 8:
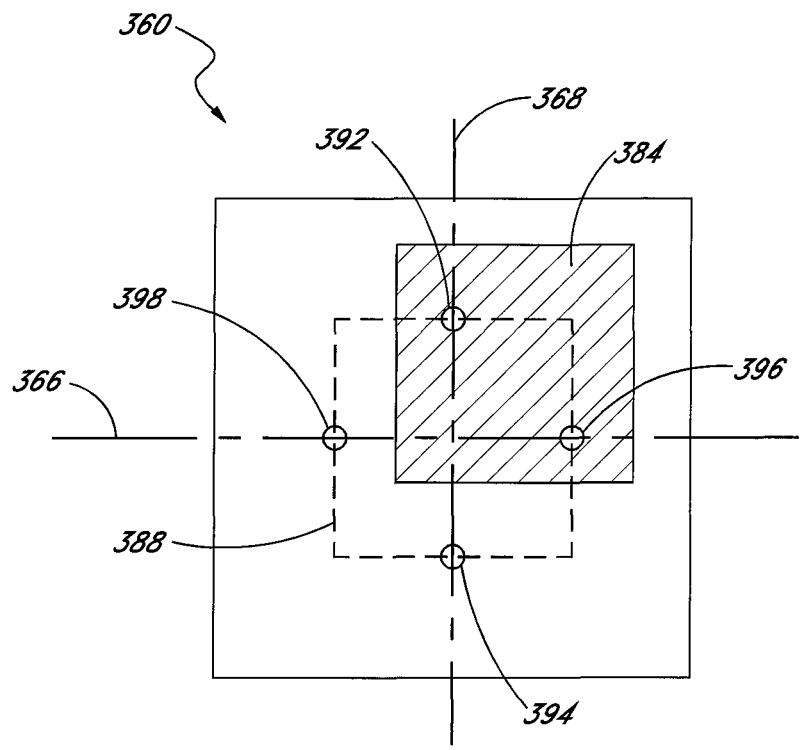
FIG. 8 is a view of another solar receiver in an irradiated state.

FIG. 8 illustrates an embodiment of a solar receiver 360 similar to that shown in FIGS. 5-7. Unless otherwise indicated, numerical designations for components are similar to those used above in FIGS. 5-7, except that they have been incremented by 100.

A two-dimensional system is shown, wherein the misalignment of the concentrated sunlight 384 in two directions is detected. Third and fourth thermal sensors 396, 398 are positioned along the horizontal centerline 366, and offset in the horizontal direction from the vertical centerline 368. Similar to the first and second thermal sensors 392, 394, the third and fourth thermal sensors 396, 398 are preferably substantially the same distance from the vertical centerline 368. The solar receiver 360 can be part of the overall solar system or a separate portion of a solar receiver receiving concentrated sunlight from a solar concentrator, but used exclusively for detecting and correcting misalignment error.

The concentrated sunlight 384 is offset from the centerlines 366, 368 in both horizontal and vertical directions. When positioned as shown, the concentrated sunlight 384 creates a measurable temperature difference in the thermal sensors wherein the first thermal sensor 392 detects a higher temperature than the second thermal sensor 394, and the third temperature sensor 396 detects a higher temperature than the fourth thermal sensor 398. A system controller receiving information from the thermal sensors 392, 394, 396, 398 can therefore adjust the position of the solar system to reduce the misalignment and desirably direct the concentrated sunlight more fully onto the solar cell. The features shown in FIG. 8 can be incorporated into other embodiments, and features described with respect to various other embodiments can be incorporated into an embodiment similar to that shown in FIG. 8.

Figure 9:
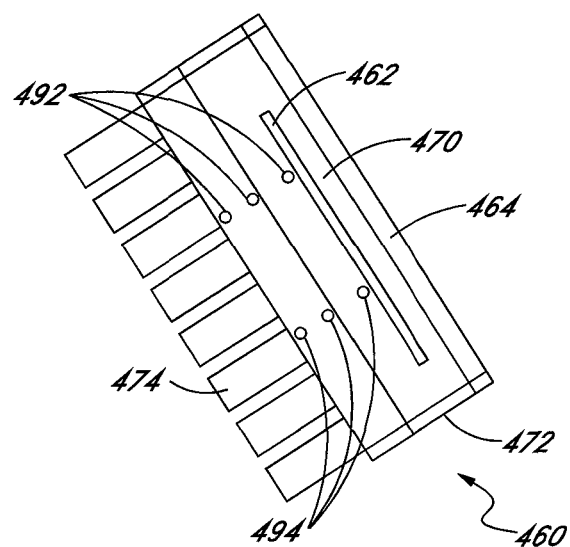
FIG. 9 is a side view of a solar receiver.

FIG. 9 illustrates a cross-sectional view of a solar receiver 460. Unless otherwise indicated, numerical designations for components are similar to those used above in FIGS. 5-7, except that they have been incremented by 200. Multiple possible positions are shown for thermal sensors 492, 494.

The solar receiver 460 can include the solar cell 462, a transparent cover 464, an encapsulent 470, a frame 472, and one or more thermal spreading features 474, among others. The solar cell 462 can be a back-contact, back-junction solar cell, or other type as appropriate. The transparent cover can be a glass or acrylic sheet, preferably including an anti-reflective coating. The encapsulent can surround and support the solar cell 462 beneath the transparent cover 464. The frame 472 can support the solar cell 462, encapsulent 470, and transparent cover 464, as well as a backsheet, or other included components which can vary between embodiments, such as diodes, interconnects, and the like. The thermal spreading features 474 can include fins, as shown, as well as thermal spreaders, including an adhesive or other paste having high thermal conduction properties. The overall solar receiver 460 can be formed as a solar module or solar panel supported by the frame 472.

The first and second thermal sensors 492, 494 can be coupled to the solar cell 462, preferably on the outside surface of the backsheet to allow thermal coupling to the cell after the receiver is manufactured. The thermal sensors 492,494 can be disposed in and/or surrounded by the encapsulent 470. The thermal sensors 492, 494 can be coupled to a backsheet, if present, or otherwise positioned in the laminate formed around the solar cell 462. When disposed within the solar receiver 460, leads can pass back through the backsheet, exiting either through a perforation, edge, or at a junction or seam through which other wiring passes. In certain embodiments, the thermal sensors 492, 494 can be incorporated as semiconductor devices into the solar cell 462.

Alternatively, the thermal sensors 492, 494 can be positioned on the thermal spreading features 474, if desired, including beneath the fins, within the heat-spreading component or thermal adhesive or other location as desired.

In certain embodiments, other types of sensors can be used. For example, pinhole or cylindrical optical sensors can be used to determine intensity of the concentrated sunlight received by the portion of the solar cell immediately surrounding the sensor. In other embodiments, detection of current and/or voltage at a particular location can be used to infer the concentration of sunlight relative to another position at which detection is done and comparison is made. Regardless of the sensor type, the determined misalignment can be used as a basis for controlling the accompanying solar system.

FIG. 10 illustrates an embodiment of a sensor coupling device 800 adjacent a portion of a solar receiver 850. The sensor coupling device 800 can include a crosspiece 810, an extension portion 820, one or more thermal sensors 830, 840, and one or more leads 804 coupled to a thermal sensor 830, 840. The solar receiver 850 comprises a module portion 860 and a fin portion 870. Accordingly, the illustrated embodiment of a sensor coupling device 800 is preferably used in those embodiments where fins are used to spread heat from the module portion 860. Preferably, at least some of the fins have at least a segment that is spaced away from the module portion 860 somewhere along the length of the module portion 860 to allow the sensor coupling device 800 to contact the module portion 860 directly, and not reside on the fin portion 870 although, in some embodiments, such an arrangement is used.

The sensor coupling device 800 is preferably composed of a material sufficient to maintain a stable shape over the temperature operating range of the solar receiver 850. Additionally, the material is preferably selected with low thermal conductivity so as to not influence the thermal gradient of the solar module. For example, plastic or ceramic can be used. The sensor coupling device 800 is preferably sized to fit among the fins of the fin portion 870 against the module portion 860. Therefore, it can be relatively narrow, as shown, or wider if permitted by the fin portion 870. The sensor coupling device 800 can have a crosspiece 810 extending in a direction substantially traverse to the extension portion 820. The crosspiece 810 can extend sufficiently far from the center of the sensor coupling device 800 to obstruct travel of the extension portion 820 between fins of the fin portion 870 when inserted. In this way, the desired positioning of the thermal sensors 830, 840 can be achieved without detailed measurements by relying on physical interference of the components. Accordingly, the thermal sensors 830, 840 are preferably located along the extension portion 820 at positions which cause them to contact the module portion 860 at desired positions when the crosspiece 810 rests against the fin portion 870.

The thermal sensors 830, 840 can function as thermal sensors for a thermal tracking system as described herein. Accordingly, they are preferably positioned at locations on the module portion 870 which permit sensing of thermal effects caused by concentrated sunlight received by the solar receiver 850 during operation of the solar system. Preferably they are spaced apart at an appropriate distance to perform sensing which allows calculation of the appropriate temperature difference. Any number of sensors can be present on a single sensor coupling device 800, as desired for the particular embodiment.

The lead 804 can be a single wire or multiple, extending from one or both of the thermal sensors 830, 840. The lead 804 can extend along the surface of the sensor coupling device 800, or along a channel or groove formed thereon.

The module portion 860 can be a frame, a backsheet, or any other portion of an individual component or assembly of the portion of the solar receiver 850 coupled to the fin portion 870. Thus, other elements comprising the solar receiver 850 can be present below the module portion 860 in the illustrated embodiment, including a photovoltaic solar cell, an encapsulant, and so on. In some embodiments, the fin portion 870 is coupled to the module portion 860 with a thermal adhesive, thermal paste, or other thermal conduction-aiding element.

Figure 11:
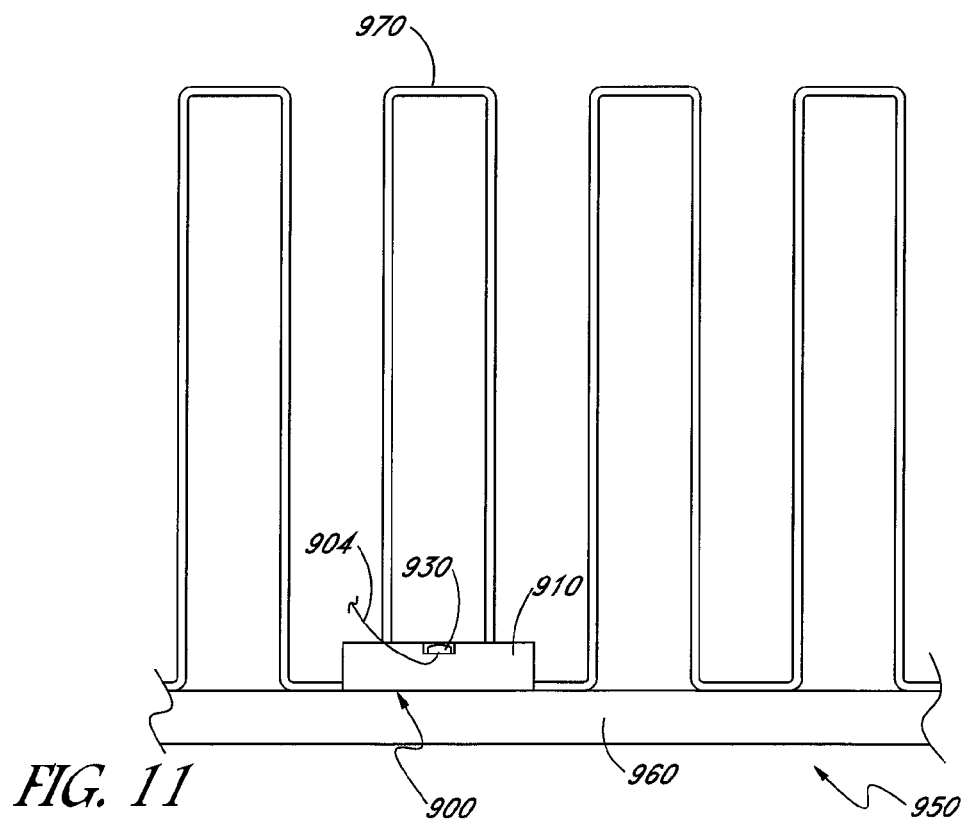
FIG. 11 is an assembled side view of the portion of the solar system of FIG. 10.

FIG. 11 illustrates a sensor coupling device 900 installed against the fin portion 970 of a solar receiver 950. Unless otherwise indicated, numerical designations for components are similar to those used above in FIG. 10, except that they have been incremented by 100. As can be seen, the crosspiece 910 extends sufficiently far out to obstruct travel of the sensor coupling device 900 between two adjacent fins of the fin portion 970.

Figure 12:
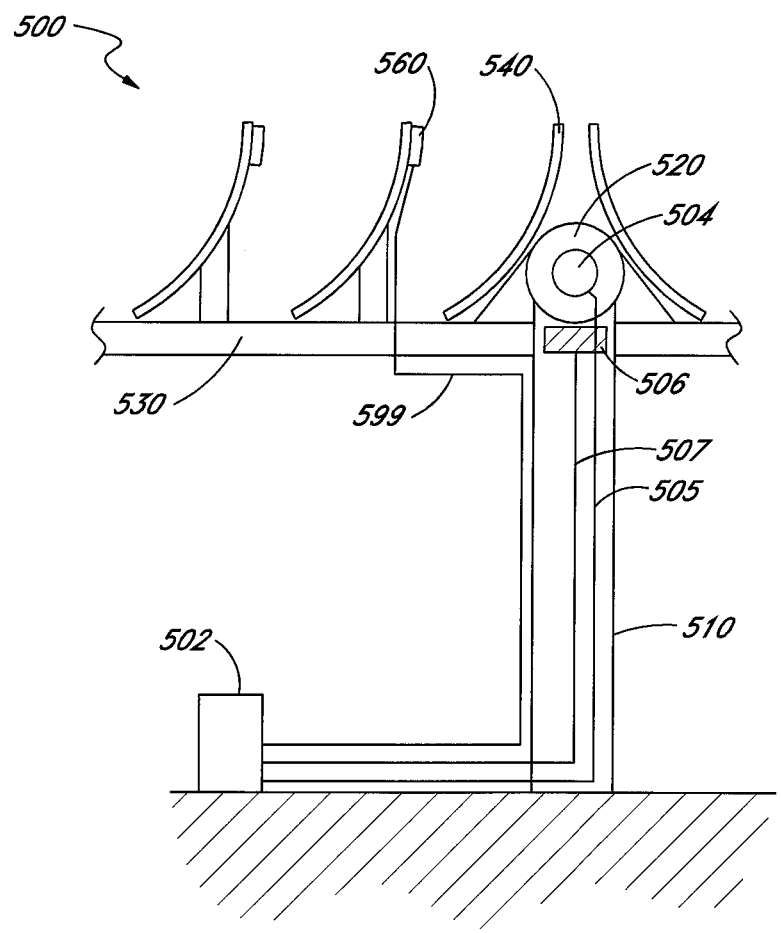
FIG. 12 is side view of a solar system.

FIG. 12 illustrates a solar system having features similar to those described above with respect to FIG. 1. Unless otherwise indicated, numerical designations for components are similar to those used above in FIG. 1, except that they have been incremented by 400. The torque tube 520 can be supported and adjusted by an elevation motor 504. Similarly, an azimuth motor 506 can support and position the torque tube 520 in a direction perpendicular to the elevation motor 504. Although one arrangement of motors is shown, other combinations can be used to adjust the position of components of the solar system 500, such as the torque tube 520 and one or more cross beams 530, thereby adjusting the position of the solar concentrators 540 and solar receivers 560. One non-limiting example is a solar system 500 at an inclined angle where one motor controls the angle of inclination, while another rotates the system about the axis of inclination.

Sensor leads 599 are shown extending from a solar receiver 560 to a control system 502. The location and travel of the leads 599 can extend along any desired path. Similarly, the particularly solar receiver 560 need not be the one to incorporate sensing features, or several or all of the solar receivers 560 of the solar system 500 can incorporate sensors. Accordingly, information conveyed from the sensing features to the control system 502 can be using a single set of leads or a plurality, depending on the embodiment.

The control system 502 can receive information from the sensing features through the sensor leads 502. The control system 502 can, in response, operate either or both of the elevation and/or azimuth motors 504, 506 to reduce the detected and interpreted misalignment error. The control system 502 can be a single device, such as a field-programmable gate array (FPGA), general purpose computer, or other micro-processor device, or a feature of such an electronic processing device which performs control operations for the solar system 500. The control system 502 can also be a voltage combiner and an amplifier that signals the motor 504 or 506 to step when the voltage reaches a threshold value.

Figure 13:
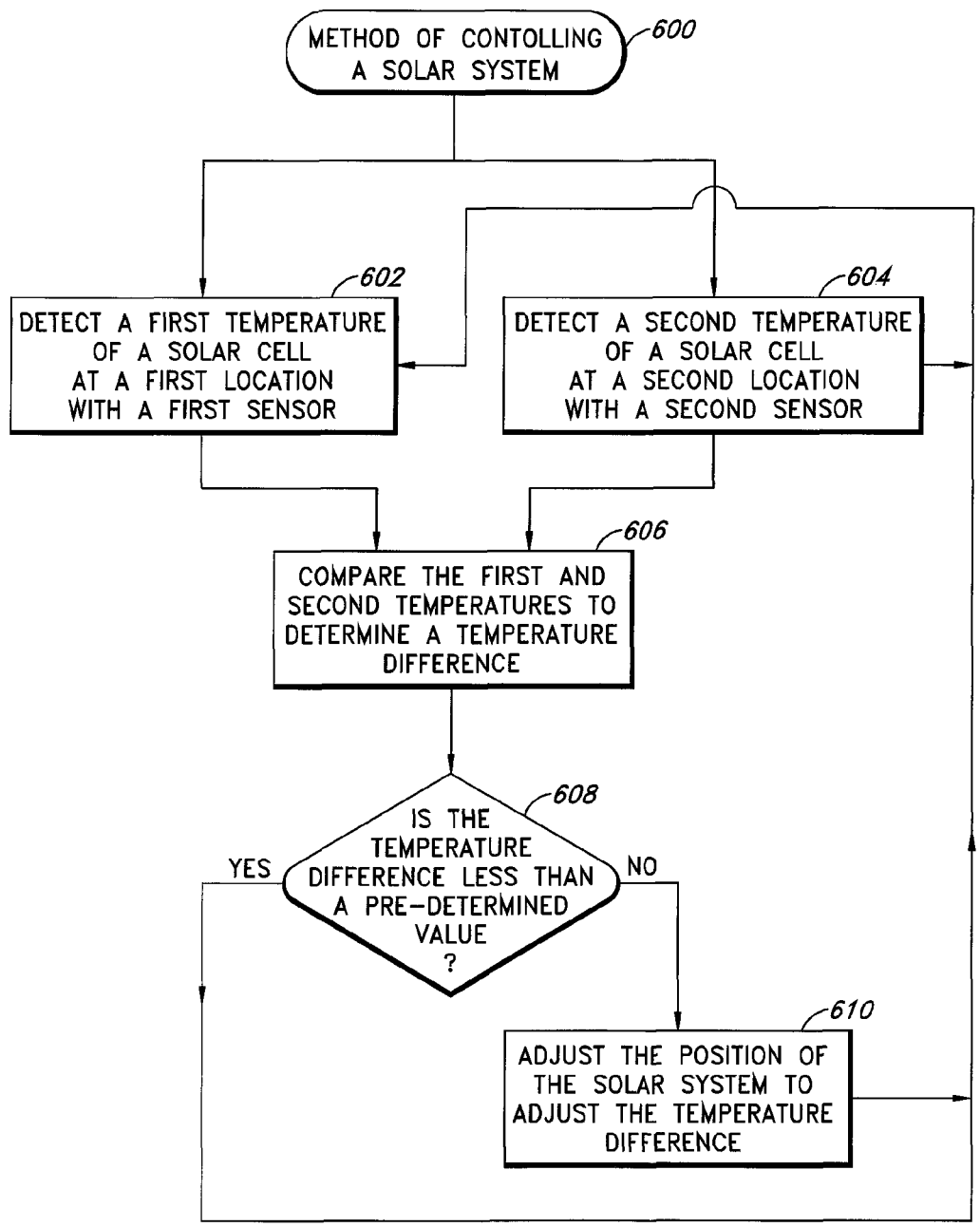
FIG. 13 is a flowchart diagram of a method of controlling the position of a solar system.
Figure 14:
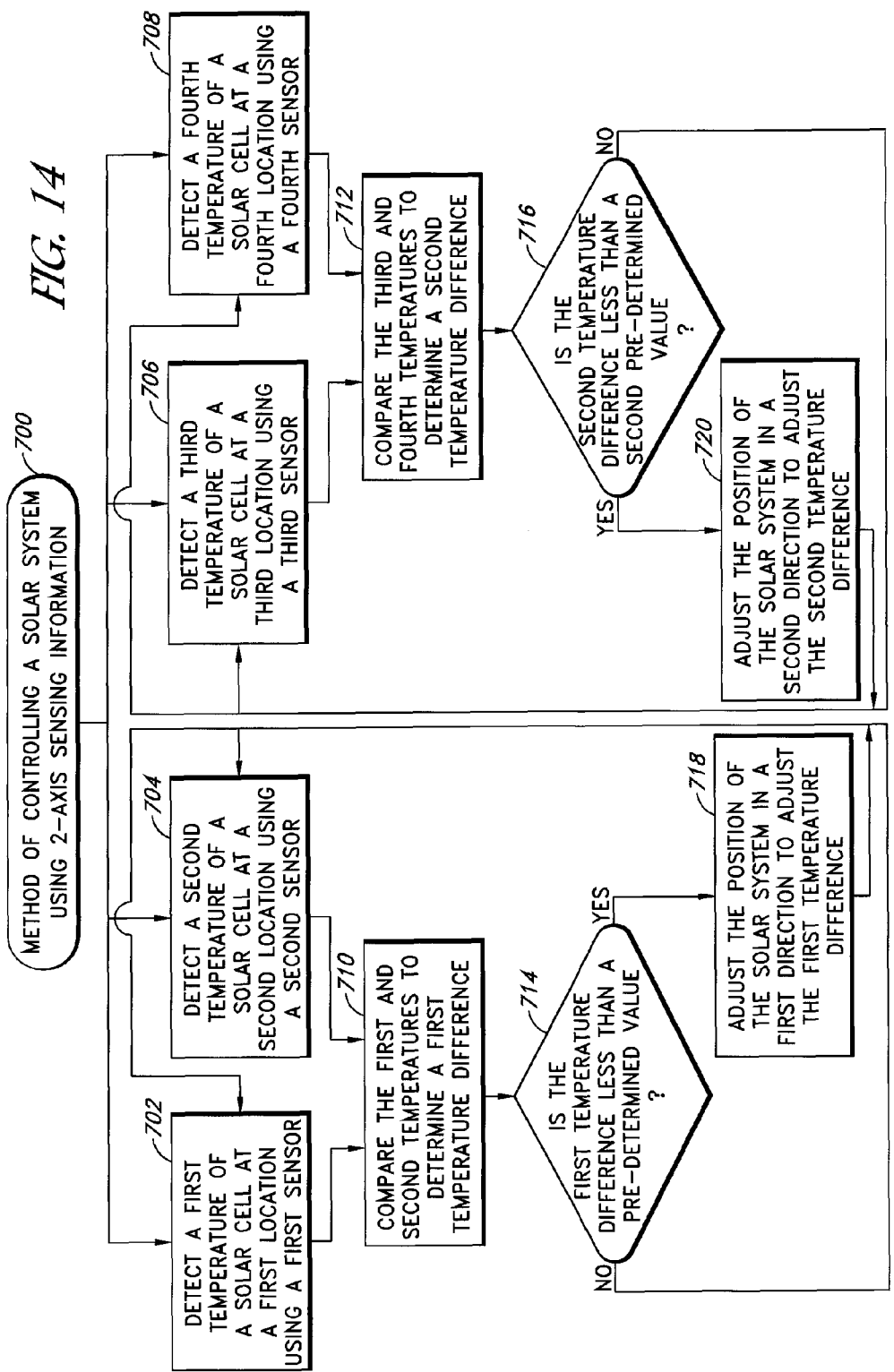
FIG. 14 is a flowchart diagram of another method of controlling the position of a solar system.

FIGS. 13 and 14 show flowchart diagrams describing techniques suitable to solar systems embodying some of the features described herein. The various tasks performed in connection with methods 600, 700 can be performed by software, hardware, firmware, or any combination thereof. For illustrative purposes, the following description of methods 600, 700 may refer to elements mentioned above in connection with FIGS. 1-12. In practice, portions of the methods 600, 700 can be performed by different elements of the described system, e.g., temperature sensors 292, 294, control system 502, and/or elevation or azimuth motors 504, 506. It should be appreciated that methods 600, 700 can include any number of additional or alternative tasks, the tasks shown in FIGS. 13 and 14 need not be performed in the illustrated order, and methods 600, 700 may be incorporated into a more comprehensive procedure or process having additional functionality not described in detail herein.

FIG. 13 illustrates a method 600 of controlling a solar system. A first sensor is used to determine a first temperature at a first location on or near a solar cell 602. As described above, the sensor can be a thermal sensor, such as a thermocouple or RTD. When determining the first temperature, the sensor can provide any of a number of different types of information for use in the determination. For example, the first sensor, as with all sensors, can provide a voltage from which an associated temperature can be obtained. Similarly, a temperature value can also be provided. Additional types of information allowing determination of temperature at the location of the sensor can be provided by different sensor types. A control system can receive the information from the first and second sensors, as shown in FIG. 12.

A second sensor can be used to determine a second temperature at a second location on or near the solar cell 604. The first and second temperatures can be compared to determine the temperature difference, or temperature gradient, across the solar cell 606. By determining the temperature difference, the angle of misalignment or tracking error or positioning error can be determined from a known temperature profile for the solar system. For example, when a temperature difference of about 10° C. per angle of misalignment is known to occur in the system, if the temperature difference is 15° C. is present, it can be inferred that the angle of misalignment is approximately 1.5°.

If it is preferred that the solar receivers operate with zero temperature difference between the first and second sensors, a control system can adjust the position of the solar system to reduce the temperature difference to approximately zero. In some embodiments, however, it can be desirable to reach a predetermined temperature gradient, rather than a zero temperature difference. For example, if the centerline of a solar cell is offset from the centerline between two thermal sensors, it might be desirable to create a specified temperature difference to properly center concentrated sunlight on the center of the solar cell as opposed to the centerline between the sensors. Accordingly, in some embodiments, it can be desirable to increase the temperature difference to reach a predetermined value.

Thus, after determining the temperature difference, an evaluation as to whether the temperature difference is equal to, less than, or greater than a predetermined value 608. In the event that, for example, a zero temperature difference is desired, and a substantially zero temperature difference is present, the method 600 can repeat to monitor for temperature differences outside the desired value. As used herein, substantially means that a value is within a defined tolerance of a predetermined value. For example, while a zero temperature difference is desirable, a value of temperature difference less than 0.01° C. might be considered acceptably close to zero for adjustment purposes.

In some embodiments, a temperature variation can be compared as an absolute value to a certain, predetermined threshold value, such as 0.05° C. Any temperature differences below the threshold value can be ignored, so as to reduce sensitivity to small variations due to system imperfections or ambient conditions which create a small, transient temperature difference. In certain embodiments, tracking can be performed by an alternate method, such as by using sun tables or light-tracking, with thermal tracking techniques used only when the temperature variation exceeds the threshold value.

Additionally, in some embodiments, it can be desirable to direct concentrated sunlight in a manner that produces an irradiant pattern which is not centered between the two thermal sensors. In such embodiments, the predetermined, desirable temperature difference between the two sensors will be non-zero and either positive or negative depending on the sensor arrangement. Accordingly, in some embodiments, it may be desirable to adjust the position of the solar system to create a temperature difference, or increase it, if necessary to better align the solar system or to adjust the solar system to a more advantageous position.

Thus, if the temperature difference exceeds the predetermined value, as in the case of a desired zero difference, or is undesirably variant from a predetermined value, the position of the solar system can be adjusted to reduce the inferred angular misalignment 610. Such adjustment can be performed by using a motor, such as an elevation motor. Preferably, the adjustment reduces the angular misalignment, thereby increasing the electrical energy output of the solar cell and overall solar system efficiency. After such an adjustment, the method 600 can be repeated as necessary to maintain desirable angular positioning. In some embodiments, several sensor areas can be evaluated to determine an overall or average detected misalignment for correction by a central controller. The sensors can be detecting temperature signals from the same cell, the same receiver, or from several cells or modules distributed across the overall solar system.

FIG. 14 illustrates a method 700 of controlling a solar system using two-axis sensing and positioning, such as in the exemplary embodiment of FIG. 8. A first sensor can be used to detect a first temperature at a first location on a solar cell 702. A second sensor can be used to detect a second temperature at a second location on the solar cell 704. Preferably, the first and second sensors are disposed along one direction across the solar cell or solar receiver. A third sensor and fourth sensor can be used to detect third and fourth temperatures at a third and fourth location on the solar cell, respectively 706, 708. Preferably, the third and fourth sensors are disposed along a second direction across the solar cell or receiver, the second direction substantially perpendicular to the first direction. The offset between any of the sensors can be chosen as desired.

The first and second temperatures can be compared to determine a first temperature difference 710. Similarly, the third and fourth temperatures can be compared to determine a second temperature difference 712. Each temperature difference can be used to determine a temperature gradient across the solar cell in the perpendicular directions. As described above with reference to method 600, the first temperature difference can be compared to a first predetermined value to ascertain whether the temperature difference correlates to an angular misalignment beyond the desired value 714. As described above, the predetermined value can be any value, including a chosen value or zero temperature difference. Similarly, the second temperature difference can be compared to a second predetermined value to determine if it exceeds the prescribed value 716. The first and second predetermined values can be the same, or different, as desired for the embodiment.

If the comparison of the first temperature difference to the first predetermined value is within an acceptable range, the method 700 can repeat as necessary. Similarly, an acceptable second temperature difference can result in repeating the method 700 for the use of the third and fourth sensors. The first and second sensors can operate at the same clock cycle as the third and fourth sensors, or on an asynchronous manner, as desired.

When the comparison of the first temperature difference to the first predetermined value correlates to an unacceptably large angular misalignment of the solar system, the position of the solar system can be adjusted 718. Because the first and second sensors are positioned along a first direction, the correlation to the solar system's position is only for one axis of the system. Thus, for example, for vertically-offset sensors, the solar system's misalignment is corrected by adjusting the solar cell's position about a horizontal axis. Similarly, for horizontally-offset sensors, the misalignment can be corrected by adjusting the solar cell's position about a vertical axis.

While positioning of a solar cell is used for exemplary purposes, in certain embodiments, adjusting the position of the solar system can result in repositioning of the solar receiver and/or solar concentrator in one or more directions simultaneously to achieve the same result. Similarly, a temperature difference detected by vertically-offset sensors can, in certain embodiments, result in adjusting of position of the solar system about an axis extending in substantially the same direction as the sensor offset but, because of the arrangement of the components, results in reduction of the angular offset. Thus, while certain directions are used for descriptive purposes herein, the actual sensor offsets and position changes can be in a variety of directions.

Thus, the second temperature difference can be compared to a second predetermined value 716 and, when the comparison results in a determination that undesirably large angular misalignment exists, the position of the solar system can be adjusted in a second direction 720. As with the first adjustment 718, the actual axis of rotation in a second direction can be aligned with the offset direction of the third and fourth sensors or another direction, as desired for the embodiment. Therefore, while in at least one embodiment the first and second sensors correlate to misalignment along an elevation axis and the third and fourth sensors correlate to misalignment along an azimuth axis, in other embodiments, the reverse can be true, or each sensor set can correlate to different axes.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power generating system comprising:
   a solar cell;
   a support structure coupled to the solar cell and adapted to adjust the position of the solar cell;
   a first thermal sensor coupled to the solar cell and adapted to detect a first temperature at a first location on the solar cell;
   a second thermal sensor coupled to the solar cell and adapted to detect a second temperature at a second location on the solar cell, the second location spaced apart from the first location;
   one or more solar concentrators adapted to concentrate sunlight onto the solar cell, the one or more solar concentrators including a first solar concentrator and a second concentrator, wherein the solar cell is coupled to a back side of the first solar concentrator such that a reflective front side of the second concentrator is positioned to reflect sunlight onto the solar cell; and
   a control system adapted to:
      receive a first signal related to the first temperature from the first thermal sensor and a second signal related to the second temperature from the second thermal sensor; and
      send a third signal to adjust the position of the solar cell by operating the support structure in response to information conveyed in the first and second signals.

2. The power generating system of claim 1, wherein the support structure comprises a motor coupled to, and adapted to be controlled by, the control system, wherein the motor is configured to adjust the position of the solar cell in response to receiving the third signal.

3. The power generating system of claim 1, the support structure comprising:
   a solar module containing the solar cell; and
   a frame supporting the solar module.

4. The power generating system of claim 1, wherein the first thermal sensor comprises a thermocouple.

5. The power generating system of claim 1, wherein the control system is adapted to compare information conveyed in the first and second signals, and wherein the control system is further adapted to determine a temperature gradient across the solar cell between the first location and the second location.

6. The power generating system of claim 5, wherein the third signal is usable to adjust the position of the solar cell to change the temperature gradient across the solar cell.

7. The power generating system of claim 1, wherein the solar cell is a back-contact solar cell.

8. A power generating system comprising:
   a solar cell;
   a support structure coupled to the solar cell and adapted to adjust the position of the solar cell;
   a first thermal sensor coupled to the solar cell and adapted to detect a first temperature at a first location on the solar cell;
   a second thermal sensor coupled to the solar cell and adapted to detect a second temperature at a second location on the solar cell, the second location spaced apart from the first location; and
   a control system adapted to:
      receive a first signal related to the first temperature from the first thermal sensor and a second signal related to the second temperature from the second thermal sensor;
      compare information conveyed in the first and second signals;
      determine a temperature gradient across the solar cell between the first location and the second location;
      send a third signal to adjust the position of the solar cell by operating the support structure in response to information conveyed in the first and second signals, wherein the third signal is usable to adjust the position of the solar cell to change the temperature gradient across the solar cell; and
      instruct a motor to adjust the position of the solar cell so as to increase a difference between the first temperature and the second temperature.

9. The power generating system of claim 8, further comprising one or more solar concentrators adapted to concentrate sunlight onto the solar cell.

10. The power generating system of claim 9, further comprising a first solar concentrator and a second concentrator, wherein the solar cell is coupled to a back side of the first solar reflector such that a reflective front side of the second concentrator is positioned to reflect sunlight onto the solar cell.

11. The power generating system of claim 8, wherein the support structure comprises a motor coupled to, and adapted to be controlled by, the control system, wherein the motor is configured to adjust the position of the solar cell in response to receiving the third signal.

12. The power generating system of claim 8, wherein the solar cell is a back-contact solar cell.

13. The power generating system of claim 8, wherein the support structure comprises:
   a solar module containing the solar cell; and
   a frame supporting the solar module.

14. The power generating system of claim 8, wherein the first thermal sensor comprises a thermocouple.

15. A power generating system comprising:
   a solar cell;
   a support structure coupled to the solar cell and adapted to adjust the position of the solar cell;
   a first thermal sensor coupled to the solar cell and adapted to detect a first temperature at a first location on the solar cell;
   a second thermal sensor coupled to the solar cell and adapted to detect a second temperature at a second location on the solar cell, the second location spaced apart from the first location;
   one or more solar concentrators adapted to concentrate sunlight onto the solar cell; and
   a control system adapted to:
      receive a first signal related to the first temperature from the first thermal sensor and a second signal related to the second temperature from the second thermal sensor; and
      send a third signal to adjust the position of the solar cell by operating the support structure in response to information conveyed in the first and second signals,
   wherein the support structure comprises a torque tube and a crossbeam supporting the one or more concentrators, and wherein the control system is adapted to rotate the torque tube to control the orientation of the one or more concentrators and the solar cell.

16. The power generating system of claim 15, further comprising a first solar concentrator and a second concentrator, wherein the solar cell is coupled to a back side of the first solar reflector such that a reflective front side of the second concentrator is positioned to reflect sunlight onto the solar cell.

17. The power generating system of claim 15, wherein the support structure comprises a motor coupled to, and adapted to be controlled by, the control system, wherein the motor is configured to adjust the position of the solar cell in response to receiving the third signal.

18. The power generating system of claim 15, wherein the support structure comprises:
   a solar module containing the solar cell; and
   a frame supporting the solar module.

19. The power generating system of claim 15, wherein the first thermal sensor comprises a thermocouple.

20. The power generating system of claim 15, wherein the first thermal sensor comprises a thermocouple.

* * * * *